(12) United States Patent
Campbell et al.

(10) Patent No.: US 7,907,406 B1
(45) Date of Patent: *Mar. 15, 2011

(54) SYSTEM AND METHOD FOR STANDBY MODE COOLING OF A LIQUID-COOLED ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/567,954

(22) Filed: Sep. 28, 2009

(51) Int. Cl.
*H05K 7/20* (2006.01)

(52) U.S. Cl. ............... 361/699; 361/701; 165/104.33; 62/259.2

(58) Field of Classification Search .................. None
See application file for complete search history.

(56) References Cited

U.S. PATENT DOCUMENTS

| | | | |
|---|---|---|---|
| 3,754,596 A | 8/1973 | Ward, Jr. | |
| 4,590,538 A | 5/1986 | Cray, Jr. | |
| 5,198,962 A | 3/1993 | Tyson | |
| 6,182,742 B1 * | 2/2001 | Takahashi et al. | ........ 165/104.33 |
| 6,349,391 B1 | 2/2002 | Petivan et al. | |
| 6,374,627 B1 | 4/2002 | Schumacher et al. | |
| 6,494,050 B2 | 12/2002 | Spinazzola et al. | |
| 6,587,343 B2 | 7/2003 | Novotny et al. | |
| 6,763,880 B1 | 7/2004 | Shih | |
| 6,854,284 B2 | 2/2005 | Bash et al. | |

(Continued)

FOREIGN PATENT DOCUMENTS

DE 19845821 B4 4/2000

OTHER PUBLICATIONS

Morogan, "IBM Hints at Triple Redundancy in Power6", (http://www.itjungle.com/breaking/bn032906-story-1.html) (Mar. 29, 2006).

(Continued)

*Primary Examiner* — Boris L Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

System and method are provided for cooling an electronics rack. A modular cooling unit (MCU) is associated with the rack to provide system coolant to an electronics subsystem and a bulk power assembly. The MCU includes a liquid-to-liquid heat exchanger, and defines portions of facility and system coolant loops. Chilled coolant from a facility source is passed through the liquid-to-liquid heat exchanger to cool system coolant flowing through the system coolant loop. The system also includes an air-to-liquid heat exchanger in fluid communication with the system coolant loop, a pump in fluid communication with the system coolant loop, and a controller. The controller controls operation of the pump to adjust flow of system coolant through the system coolant loop dependent upon a mode of operation. In a standby mode, system coolant flows through the air-to-liquid heat exchanger at a lower flow rate, and expels heat to ambient air.

20 Claims, 13 Drawing Sheets

U.S. PATENT DOCUMENTS

| | | |
|---|---|---|
| 6,854,287 B2 | 2/2005 | Patel et al. |
| 6,867,970 B2 | 3/2005 | Muller et al. |
| 6,927,980 B2 | 8/2005 | Fukuda et al. |
| 7,000,467 B2 * | 2/2006 | Chu et al. .................. 73/299 |
| 7,002,799 B2 | 2/2006 | Malone et al. |
| 7,011,143 B2 | 3/2006 | Corrado et al. |
| 7,088,585 B2 * | 8/2006 | Chu et al. .................. 361/699 |
| 7,106,590 B2 | 9/2006 | Chu et al. |
| 7,110,260 B2 | 9/2006 | Weber et al. |
| 7,236,363 B2 | 6/2007 | Belady |
| 7,254,957 B2 * | 8/2007 | Weber et al. .............. 62/259.2 |
| 7,315,448 B1 * | 1/2008 | Bash et al. ................. 361/701 |
| 7,400,505 B2 | 7/2008 | Campbell et al. |
| 7,641,101 B2 | 1/2010 | Campbell et al. |
| 7,757,506 B2 * | 7/2010 | Ellsworth et al. ........... 62/259.2 |
| 2004/0008483 A1 * | 1/2004 | Cheon ....................... 361/687 |
| 2004/0221604 A1 * | 11/2004 | Ota et al. ................... 62/259.2 |
| 2005/0061541 A1 | 3/2005 | Belady |
| 2006/0002086 A1 | 1/2006 | Teneketges et al. |
| 2007/0101334 A1 | 5/2007 | Atyam et al. |
| 2007/0119569 A1 | 5/2007 | Campbell et al. |
| 2007/0227710 A1 | 10/2007 | Belady et al. |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2009/0126910 A1 * | 5/2009 | Campbell et al. ........ 165/104.33 |
| 2010/0067193 A1 | 3/2010 | Arimilli et al. |
| 2010/0263855 A1 | 10/2010 | Arimilli et al. |

OTHER PUBLICATIONS

Arent, "Liquid Coolant Distribution Unit with Convertible Air or Water Cooling", IBM Technical Disclosure Bulletin, IP Prior Art Database, IP.com No. IPCOM000044828D (Feb. 6, 2005).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

D. Delia et al., "System Cooling Design for the Water-Cooled IBM Enterprise System/900 Processors", IBM Journal of Research and Development, vol. 36, No. 4, pp. 791-803 (Jul. 1992).

* cited by examiner

SYSTEM AND METHOD FOR STANDBY MODE COOLING OF A LIQUID-COOLED ELECTRONICS RACK

STATEMENT REGARDING FEDERALLY SPONSORED RESEARCH OR DEVELOPMENT

This invention was made with government support under DARPA Contract No. HR0011-07-9-0002, awarded by the Department of Defense. Accordingly, the United States government may have certain rights in the invention

BACKGROUND

The present invention relates in general to apparatuses and methods for facilitating operation of liquid-cooled, rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

The shortcomings of the prior art are overcome and additional advantages are provided through the provision of a system for facilitating cooling of components of an electronics rack comprising at least one heat-generating electronics subsystem and at least one bulk power assembly providing power to the at least one electronics subsystem. The system includes: at least one modular cooling unit (MCU) associated with the electronics rack and configured to provide, via a system coolant loop, system coolant to the at least one heat-generating electronics subsystem and the at least one bulk power assembly for facilitating cooling thereof, wherein each MCU of the at least one MCU comprises a liquid-to-liquid heat exchanger, a facility coolant loop portion and a system coolant loop portion, and when in normal operating mode, a facility coolant loop receives chilled coolant from a source and passes at least a portion thereof through the liquid-to-liquid heat exchanger of each MCU via the facility coolant loop portion thereof, and the system coolant loop provides cooled system coolant to the at least one heat-generating electronics subsystem and the at least one bulk power assembly, and expels heat in the liquid-to-liquid heat exchanger from the at least one heat-generating electronics subsystem and the at least one bulk power assembly to the chilled coolant in the facility coolant loop; an air-to-liquid heat exchanger associated with the electronics rack and in fluid communication with the system coolant loop; at least one pump in fluid communication with the system coolant loop; and a controller coupled to the at least one pump for adjusting operation of the at least one pump to control flow rate of system coolant through the system coolant loop dependent upon a mode of operation, wherein in the normal operating mode, a first system coolant flow rate is provided through the system coolant loop to cool the at least one heat-generating electronics subsystem and the at least one bulk power assembly, and in standby mode, a second system coolant flow rate is provided through the system coolant loop to cool the at least one bulk power assembly, wherein the first system coolant flow rate is greater than the second system coolant flow rate, and wherein in standby mode, at least a portion of the system coolant flowing through the system coolant loop passes through the air-to-liquid heat exchanger and expels heat in the air-to-liquid heat exchanger from the at least one bulk power assembly to ambient air.

In another aspect, a cooled electronics system is provided. The cooled electronics system includes: an electronics rack comprising at least one heat-generating electronics subsystem and at least one bulk power assembly providing power to the at least one heat-generating electronics subsystem; at least one modular cooling unit (MCU) associated with the electronics rack and configured to provide, via a system coolant loop, system coolant to the at least one heat-generating electronics subsystem and the at least one bulk power assembly for facilitating cooling thereof, wherein each MCU of the at least one MCU comprises a liquid-to-liquid heat exchanger, a facility coolant loop portion and a system coolant loop portion, and wherein in normal operating mode, a facility coolant loop receives chilled coolant from a source and passes at least a portion thereof through the liquid-to-liquid heat exchanger of each MCU via the facility coolant loop portion thereof, and the system coolant loop provides cooled system coolant to the at least one heat-generating electronics subsystem and the at least one bulk power assembly, and expels heat in the liquid-to-liquid heat exchanger from the at least one heat-generating electronics subsystem and the at least one bulk power assembly to the chilled coolant in the facility coolant loop; an air-to-liquid heat exchanger associated with the electronics rack and in fluid communication with the system coolant loop; at least one pump in fluid communication with the system coolant loop; and a controller coupled to the at least one pump for adjusting operation of the at least one pump to control flow rate of system coolant through the system coolant loop dependent upon a mode of operation, wherein in the normal operating mode, a first system coolant flow rate is provided through the system coolant loop to cool the at least one heat-generating electronics subsystem and the at least one bulk power assembly, and in a standby mode, a second system coolant flow rate is provided through the system coolant loop to cool the at least one bulk power assembly, wherein the first system coolant flow rate is greater than the second system coolant flow rate, and wherein in standby mode, at least a portion of the system coolant flowing through the system coolant loop passes through the air-to-liquid heat exchanger and expels heat in the air-to-liquid heat exchanger from the at least one bulk power assembly to ambient air.

In a further aspect, a method of cooling components of an electronics rack comprising at least one heat-generating electronics subsystem and at least one bulk power assembly providing power to the at least one heat-generating electronics subsystem is provided. The method includes: employing at least one modular cooling unit (MCU) associated with the electronics rack to provide, via a system coolant loop, system coolant to the at least one heat-generating electronics subsystem and the at least one bulk power assembly for facilitating cooling thereof, wherein each MCU of the at least one MCU includes a liquid-to-liquid heat exchanger, a facility coolant loop portion and a system coolant loop portion, and when in normal operating mode, a facility coolant loop receives chilled coolant from a source and passes at least a portion thereof through the liquid-to-liquid heat exchanger of each MCU via the facility coolant loop portion thereof, and the system coolant loop provides cooled system coolant to the at least one heat-generating electronics subsystem and the at least one bulk power assembly, and expels heat in the liquid-to-liquid heat exchanger from the at least one heat-generating electronics subsystem and the at least one bulk power assembly to the chilled coolant in the facility coolant loop; pumping at least a portion of the system coolant in the system coolant loop through an air-to-liquid heat exchanger associated with the electronics rack and in fluid communication with the system coolant loop; and controlling at least one pump in fluid communication with the system coolant loop to control flow rate of system coolant through the system coolant loop dependent upon a mode of operation, wherein in normal operating mode, a first system coolant flow rate is provided through the system coolant loop to cool the at least one heat-generating electronics subsystem and the at least one bulk power assembly, and in a standby mode, a second system coolant flow rate is provided through the system coolant loop to cool the at least one bulk power assembly, wherein the first system coolant flow rate is greater than the second system coolant flow rate, and wherein in standby mode, at least a portion of the system coolant flowing through the system coolant loop passes through the air-to-liquid heat exchanger and expels heat in the air-to-liquid heat exchanger from the at least one bulk power assembly to ambient air.

Additional features and advantages are realized through the techniques of the present invention. Other embodiments and aspects of the invention are described in detail herein and are considered part of a the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
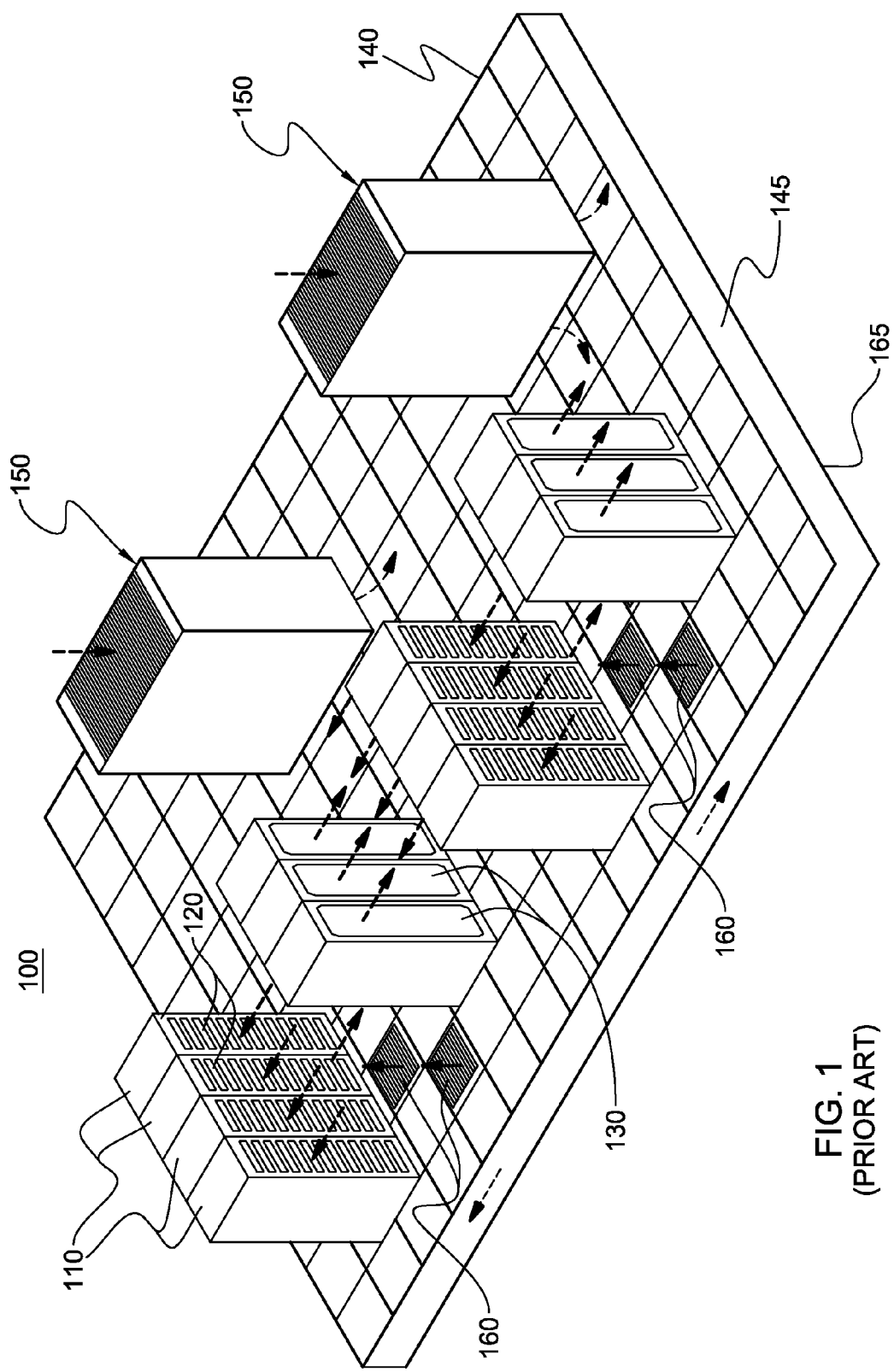
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides 130 of the electronics racks 110.

Figure 2:
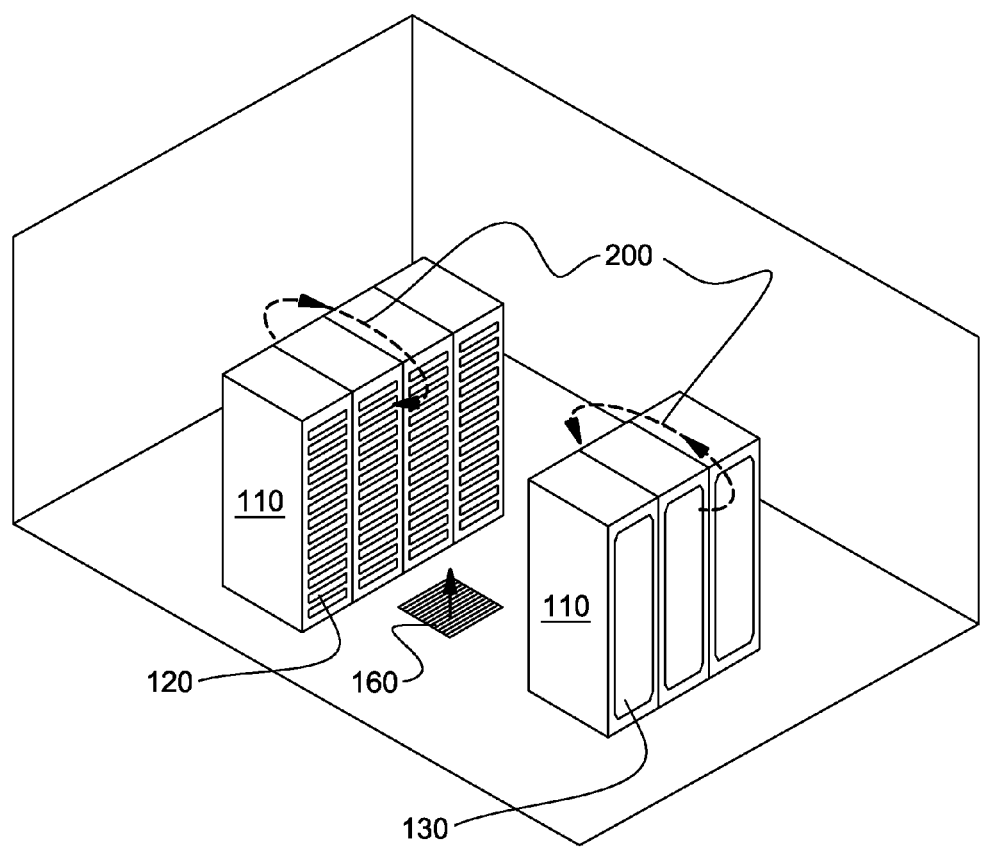
FIG. 2 depicts one problem addressed by the present invention, showing recirculation airflow patterns in one implementation of a raised floor layout of an air-cooled computer installation, in accordance with an aspect of the present invention.

Due to the ever increasing air flow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This re-circulating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system (s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to maintain the temperature of the inlet air uniform. The efficient cooling of such computer and electronic systems, and the amelioration of localized hot air inlet temperatures to one or more rack units due to recirculation of air currents, are addressed by the apparatuses and methods disclosed herein.

Figure 3:
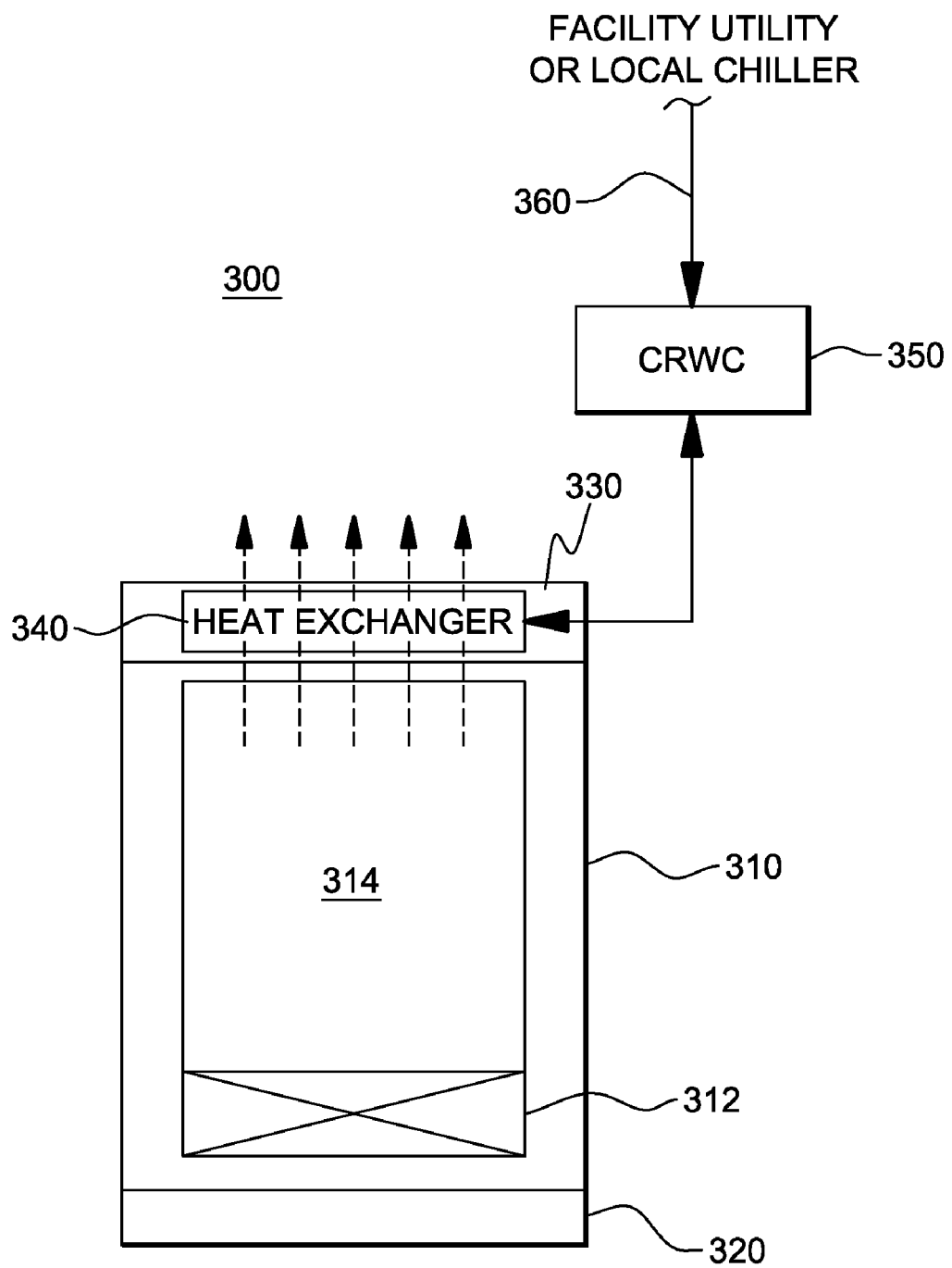
FIG. 3 is a cross-sectional plan view of one embodiment of an electronics rack utilizing at least one air-to-liquid heat exchanger disposed at the air outlet side of the electronics rack, in accordance with an aspect of the present invention.

FIG. 3 depicts one embodiment of a cooled electronics system, generally denoted 300, in accordance with one aspect of the present invention. In this embodiment, electronics system 300 includes one electronics rack 310 having an inlet door cover 320 and an outlet door cover 330 which have openings to allow for the ingress and egress of external air from the inlet side to the outlet side of the electronics rack 310. The system further includes at least one air moving device 312 for moving external air across at least one electronics drawer unit 314 positioned within the electronics rack. Disposed within outlet door cover 330 is a heat exchange assembly 340. Heat exchange assembly 340 includes an air-to-liquid heat exchanger through which the inlet-to-outlet air flow through the electronics rack passes. In this embodiment, a computer room water conditioner (CRWC) 350 is used to buffer heat exchange assembly 340 from the building utility or local chiller coolant 360, which is provided as input to CRWC 350. The CRWC 350 provides system water or system coolant to heat exchange assembly 340. Heat exchange assembly 340 removes heat from the exhausted inlet-to-outlet air flow through the electronics rack for transfer via the system water or coolant to CRWC 350. Advantageously, providing a heat exchange assembly with an air-to-liquid heat exchanger such as disclosed herein at the outlet door cover of one or more electronics racks in a computer installation can significantly reduce heat loads on existing air conditioning units within the computer installation, and facilitate the cooling of the rack-mounted electronics units.

Figure 4:
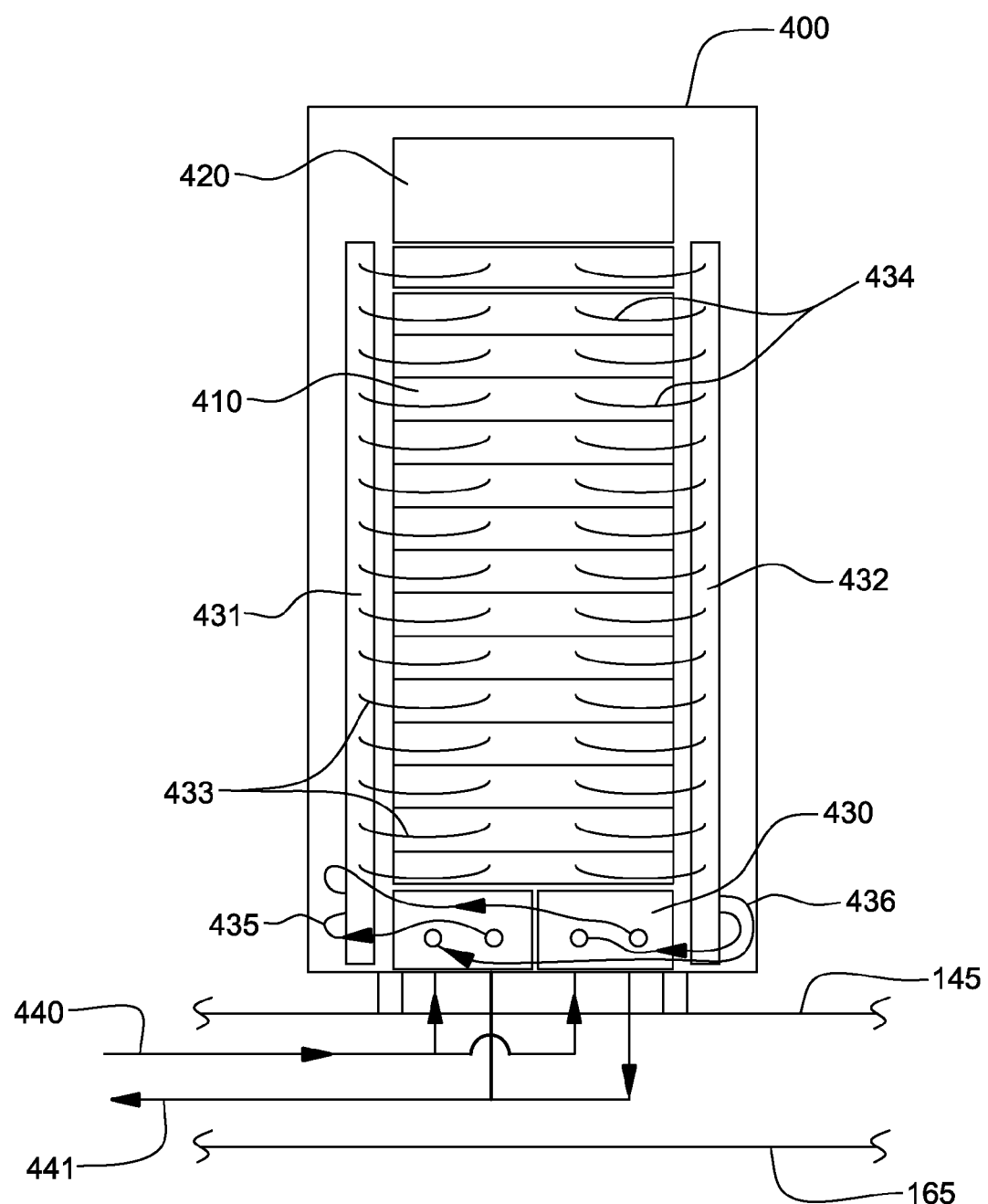
FIG. 4 is a front elevational view of one embodiment of a liquid-cooled electronics rack comprising multiple electronics subsystems cooled by an apparatus, in accordance with an aspect of the present invention.

FIG. 4 depicts one embodiment of a liquid-cooled electronics rack 400 which employs a cooling system to be operated utilizing the systems and methods described herein. In one embodiment, liquid-cooled electronics rack 400 comprises a plurality of electronics subsystems 410, which are processor or server nodes. A bulk power assembly 420 is shown disposed at an upper portion of liquid-cooled electronics rack 400, and two modular cooling units (MCUs) 430 are disposed in a lower portion of the liquid-cooled electronics rack. In the embodiments described herein, the coolant is assumed to be water or an aqueous-based solution, again, by way of example only.

In addition to MCUs 430, the cooling system includes a system water supply manifold 431, a system water return manifold 432, and manifold-to-node fluid connect hoses 433 coupling system water supply manifold 431 to electronics subsystems 410, and node-to-manifold fluid connect hoses 434 coupling the individual electronics subsystems 410 to system water return manifold 432. Each MCU 430 is in fluid communication with system water supply manifold 431 via a respective system water supply hose 435, and each MWCU 430 is in fluid communication with system water return manifold 432 via a respective system water return hose 436.

As illustrated, heat load of the electronics subsystems is transferred from the system water to cooler facility water supplied by facility water supply line 440 and facility water return line 441 disposed, in the illustrated embodiment, in the space between a raised floor 145 and a base floor 165.

Figure 5:
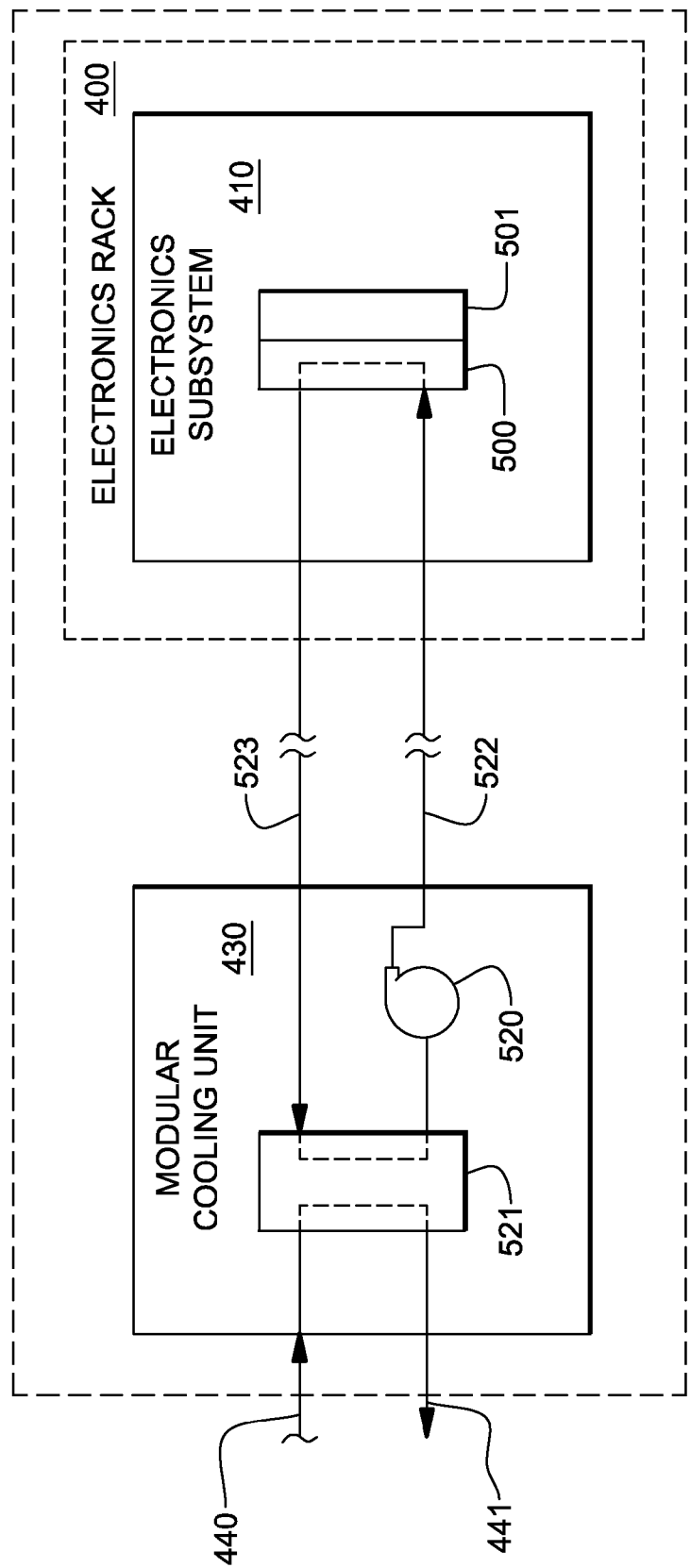
FIG. 5 is a schematic of one embodiment of an electronics subsystem of an electronics rack, wherein an electronics module is liquid-cooled by system coolant provided by one or more modular cooling units disposed within the electronics rack, in accordance with an aspect of the present invention.

FIG. 5 schematically illustrates operation of the cooling system of FIG. 4, wherein a liquid-cooled cold plate 500 is shown coupled to an electronics module 501 of an electronics subsystem 410 within the liquid-cooled electronics rack 400. Heat is removed from electronics module 501 via the system coolant circulated via pump 520 through cold plate 500 within the system coolant loop defined by liquid-to-liquid heat exchanger 521 of modular cooling unit 430, lines 522, 523 and cold plate 500. The system coolant loop and modular cooling unit are designed to provide coolant of a controlled temperature and pressure, as well as controlled chemistry and cleanliness to the electronics module(s). Furthermore, the system coolant is physically separate from the less controlled facility coolant in lines 440, 441, to which heat is ultimately transferred.

Figure 6:
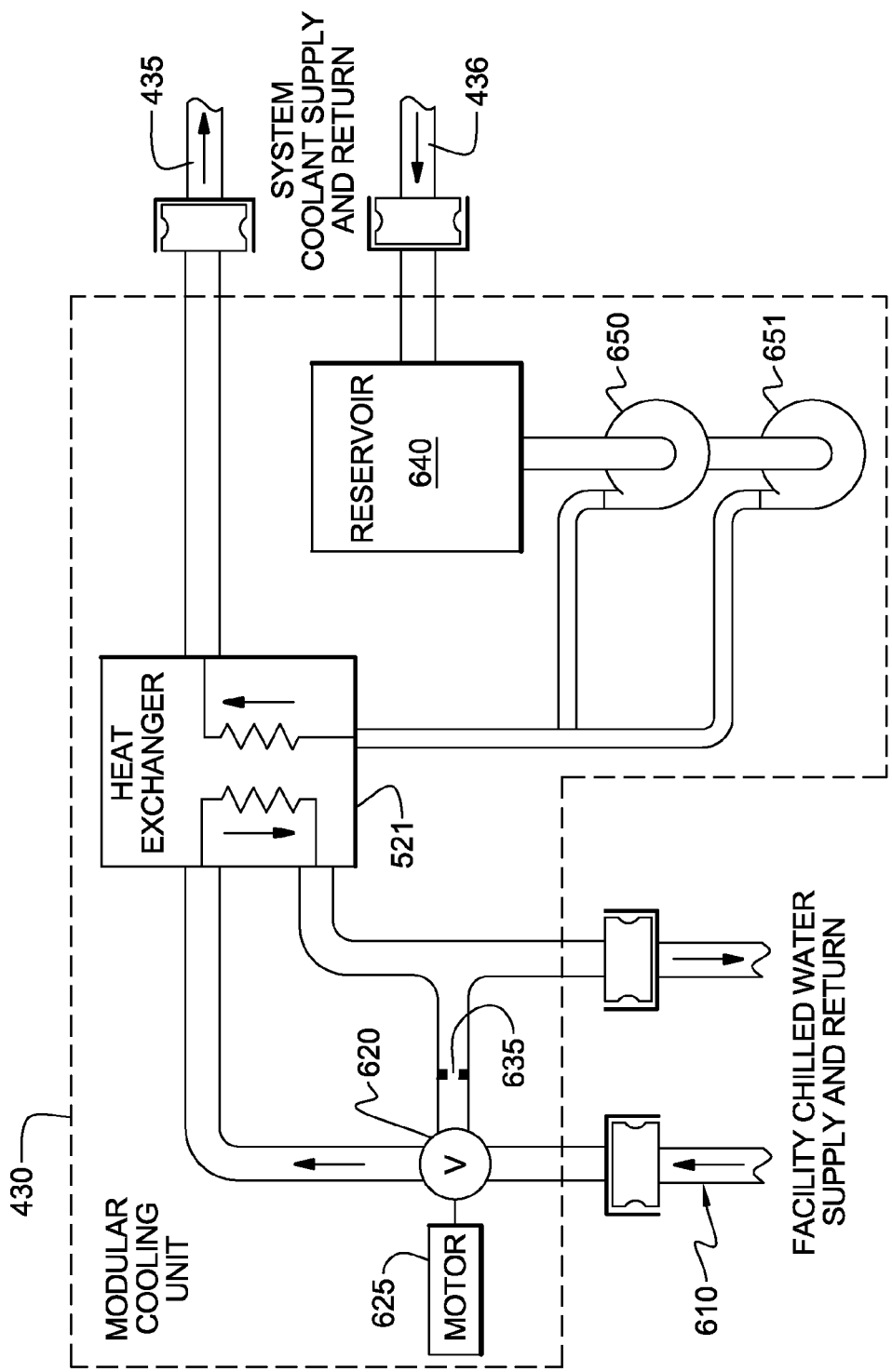
FIG. 6 is a schematic of one embodiment of a modular cooling unit disposed within a liquid-cooled electronics rack, in accordance with an aspect of the present invention.

FIG. 6 depicts a more detailed embodiment of a modular cooling unit 430, in accordance with an aspect of the present invention. As shown in FIG. 6, modular cooling unit 430 includes a facility coolant loop wherein building chilled, facility coolant is supplied 610 and passes through a control valve 620 driven by a motor 625. Valve 620 determines an amount of facility coolant to be passed through heat exchanger 521, with a portion of the facility coolant possibly being returned directly via a bypass orifice 635. The modular cooling unit further includes a system coolant loop with a reservoir tank 640 from which system coolant is pumped, either by pump 650 or pump 651, into the heat exchanger 521 for conditioning and output thereof, as cooled system coolant to the electronics rack to be cooled. The cooled system coolant is supplied to the system supply manifold and system return manifold of the liquid-cooled electronics rack via the system water supply hose 435 and system water return hose 436.

Figure 7:
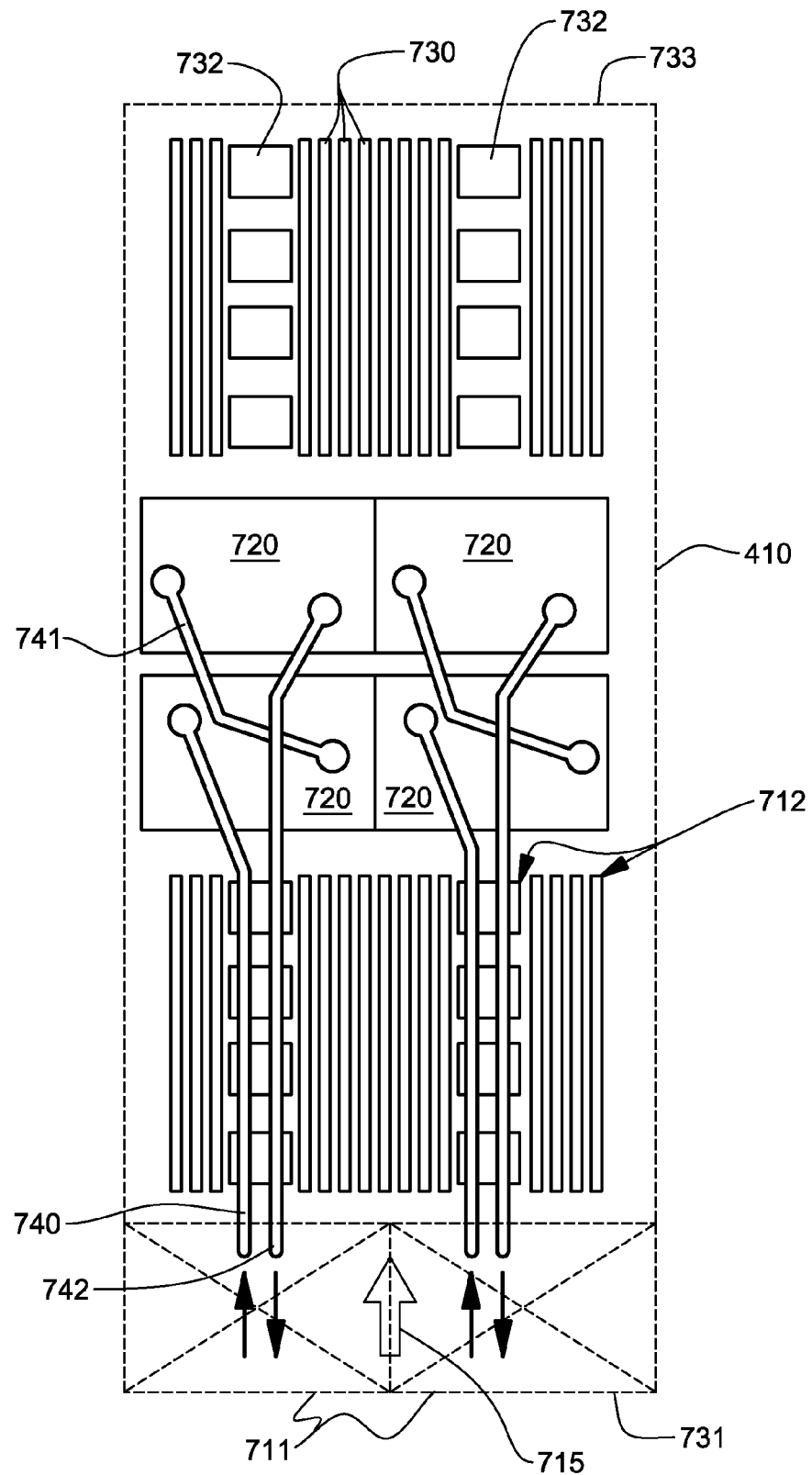
FIG. 7 is a plan view of one embodiment of an electronics subsystem layout illustrating an air and liquid cooling subsystem for cooling components of the electronics subsystem, in accordance with an aspect of the present invention.

FIG. 7 depicts one embodiment of an electronics subsystem 410 component layout wherein one or more air moving devices 711 provide forced air flow 715 in normal operating mode to cool multiple components 712 within electronics subsystem 713. Cool air is taken in through a front 731 and exhausted out a back 733 of the drawer. The multiple components to be cooled include multiple processor modules to which liquid-cooled cold plates 720 (of a liquid-based cooling system) are coupled, as well as multiple arrays of memory modules 730 (e.g., dual in-line memory modules (DIMMs)) and multiple rows of memory support modules 732 (e.g., DIMM control modules) to which air-cooled heat sinks are coupled. In the embodiment illustrated, memory modules 730 and the memory support modules 732 are partially arrayed near front 731 of electronics subsystem 410, and partially arrayed near back 733 of electronics subsystem 410. Also, in the embodiment of FIG. 7, memory modules 730 and the memory support modules 732 are cooled by air flow 715 across the electronics subsystem.

The illustrated liquid-based cooling system further includes multiple coolant-carrying tubes connected to and in fluid communication with liquid-cooled cold plates 720. The coolant-carrying tubes comprise sets of coolant-carrying tubes, with each set including (for example) a coolant supply tube 740, a bridge tube 741 and a coolant return tube 742. In this example, each set of tubes provides liquid coolant to a series-connected pair of cold plates 720 (coupled to a pair of processor modules). Coolant flows into a first cold plate of each pair via the coolant supply tube 740 and from the first cold plate to a second cold plate of the pair via bridge tube or line 741, which may or may not be thermally conductive. From the second cold plate of the pair, coolant is returned through the respective coolant return tube 742.

Figure 8:
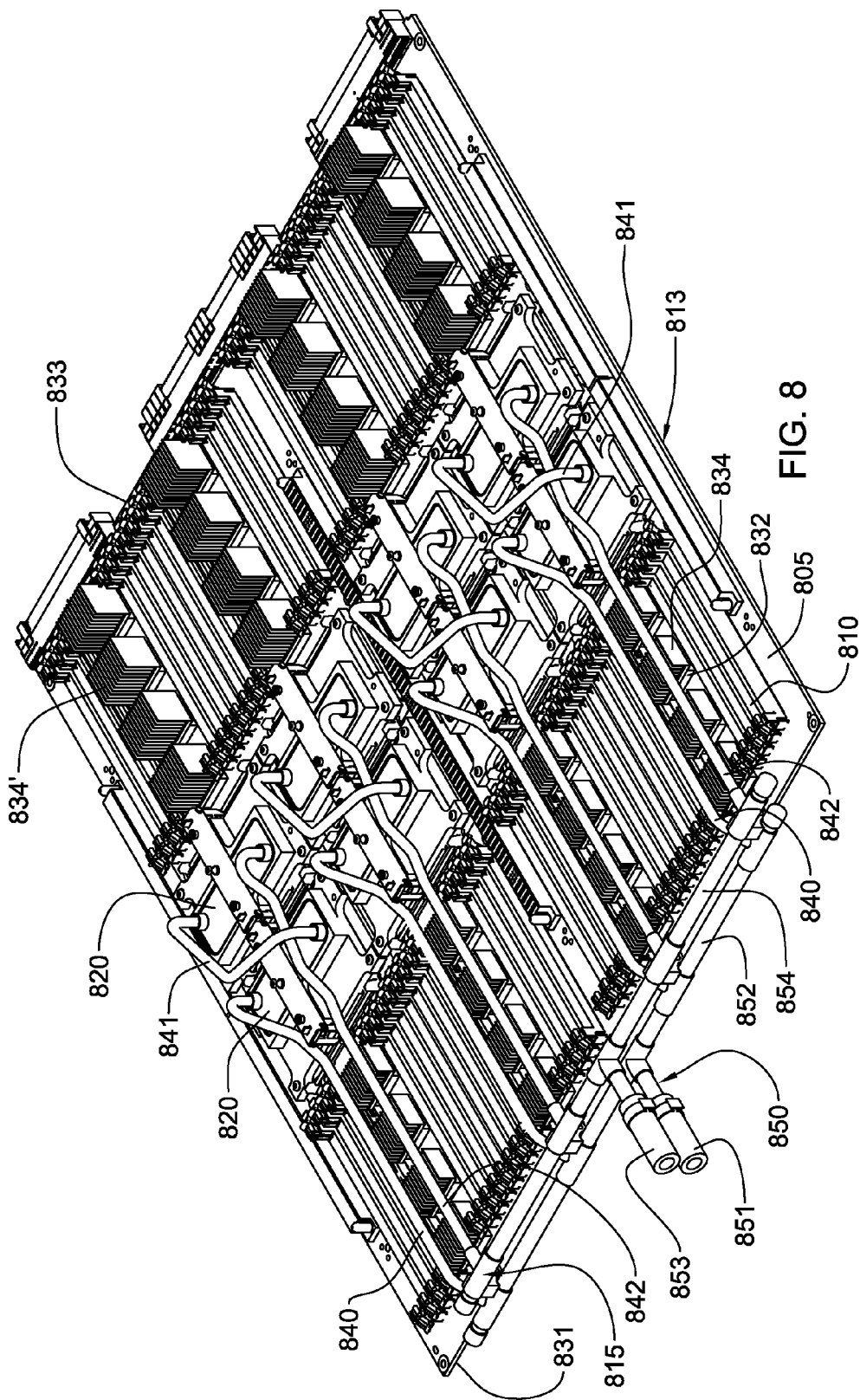
FIG. 8 depicts one detailed embodiment of a partially-assembled electronics subsystem layout, wherein the electronics subsystem includes eight heat-generating electronics components to be actively cooled, each having a respective liquid-cooled cold plate of a liquid-based cooling system coupled thereto, in accordance with an aspect of the present invention.

FIG. 8 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

The planar server assembly depicted in FIG. 8 includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 8 depicts a partially assembled electronics system 813 and an assembled liquid-based cooling system 815 coupled to selected heat generating components (e.g., including processor dies) to be cooled. In this embodiment, the electronics system is configured for (or as) an electronics drawer of an electronics rack, and includes, by way of example, a support substrate or planar board 805, a plurality of memory module sockets 810 (with the memory modules (e.g., dual in-line memory modules) not shown), multiple rows of memory support modules 832 (each having coupled thereto an air-cooled heat sink 834), and multiple processor modules (not shown) disposed below the liquid-cooled cold plates 820 of the liquid-based cooling system 815.

In addition to liquid-cooled cold plates 820, liquid-based cooling system 815 includes multiple coolant-carrying tubes, including coolant supply tubes 840 and coolant return tubes 842 in fluid communication with respective liquid-cooled cold plates 820. The coolant-carrying tubes 840, 842 are also connected to a header (or manifold) subassembly 850 which facilitates distribution of liquid coolant to the coolant supply tubes and return of liquid coolant from the coolant return tubes 842. In this embodiment, the air-cooled heat sinks 834 coupled to memory support modules 832 closer to front 831 of electronics drawer 813 are shorter in height than the air-cooled heat sinks 834' coupled to memory support modules 832 near back 833 of electronics drawer 813. This size difference is to accommodate the coolant-carrying tubes 840, 842 since, in this embodiment, the header subassembly 850 is at the front 831 of the electronics drawer and the multiple liquid-cooled cold plates 820 are in the middle of the drawer.

Liquid-based cooling system 815 comprises (in one embodiment) a preconfigured monolithic structure which includes multiple (pre-assembled) liquid-cooled cold plates 820 configured and disposed in spaced relation to engage respective heat generating electronic components. Each liquid-cooled cold plate 820 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 820 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly (not shown) which facilitate use of the attachment assembly.

As shown in FIG. 8, header subassembly 850 includes two liquid manifolds, i.e., a coolant supply header 852 and a coolant return header 854, which in one embodiment, are coupled together via supporting brackets. In the monolithic cooling structure of FIG. 8, the coolant supply header 852 is metallurgically bonded and in fluid communication to each coolant supply tube 840, while the coolant return header 854 is metallurgically bonded and in fluid communication to each coolant return tube 852. A single coolant inlet 851 and a single coolant outlet 853 extend from the header subassembly for coupling to the electronics rack's coolant supply and return manifolds (not shown).

FIG. 8 also depicts one embodiment of the preconfigured, coolant-carrying tubes. In addition to coolant supply tubes 840 and coolant return tubes 842, bridge tubes or lines 841 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 840, bridge tubes 841 and coolant return tubes 842 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronics system to facilitate installation of the monolithic structure in engaging relation with the electronics system.

Liquid cooling of heat-generating electronics components within an electronics rack can greatly facilitate removal of heat generated by those components. However, in certain high performance systems, the heat dissipated by certain components being liquid-cooled, such as processors, may exceed the ability of the liquid cooling system to extract heat. For example, a fully configured liquid-cooled electronics rack, such as described hereinabove may dissipate approximately 72 kW of heat. Half of this heat may be removed by liquid coolant using liquid-cooled cold plates such as described above. The other half of the heat may be dissipated by memory, power supplies, etc., which are air-cooled. Given the density at which electronics racks are placed on a data center floor, existing air-conditioning facilities are stressed with such a high air heat load from the electronics rack. Thus, a solution presented herein is to incorporate an air-to-liquid heat exchanger, for example, at the air outlet side of the electronics rack, to extract heat from air egressing from the electronics rack in normal operating mode. This solution is presented herein in combination with liquid-cooled cold plate cooling of certain components within the electronics rack. To provide the necessary amount of coolant, two MCUs are associated with the electronics rack (in one embodiment), and system coolant is fed from each MCU to the air-to-liquid heat exchanger in parallel to the flow of system coolant to the liquid-cooled cold plates disposed within the one or more electronics subsystems of the electronics rack. Note that if desired, flow of system coolant to the individual liquid-cooled cold plates may be in any one of a multitude of series/parallel arrangements.

Also, for a high availability system, techniques can be provided for maintaining operation of one modular cooling unit, notwithstanding failure of another modular cooling unit of an electronics rack. This allows continued provision of system coolant to the one or more electronics subsystems of the rack being liquid-cooled. To facilitate liquid cooling of the primary heat-generating electronics components within the electronics rack, one or more isolation valves are employed (upon detection of failure at one MCU of the two MCUs) to shut off coolant flow to the air-to-liquid heat exchanger, and thereby, conserve coolant for the direct cooling of the electronics subsystems.

Figure 9:
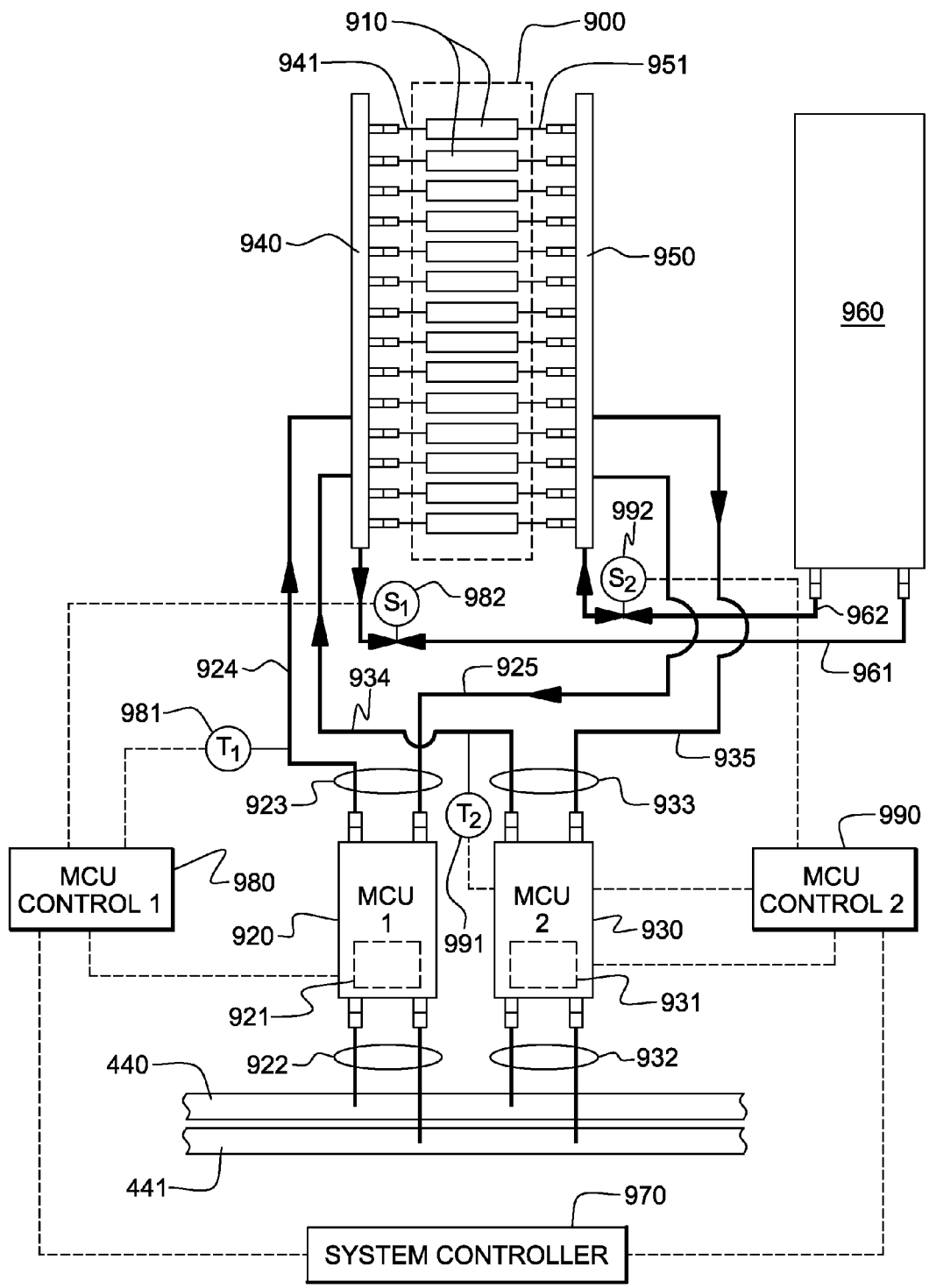
FIG. 9 is a schematic of one embodiment of a system comprising a liquid-cooled electronics rack and a cooling system associated therewith, wherein the cooling system includes two modular cooling units (MCUs) for providing in parallel liquid coolant to the electronics subsystems of the rack, and to an air-to-liquid heat exchanger disposed, for example, at an air outlet side of the electronics rack for cooling air egressing therefrom, in accordance with an aspect of the present invention.

FIG. 9 illustrates one embodiment of a system wherein an electronics rack 900 includes a plurality of heat-generating electronic subsystems 910, which are liquid-cooled employing a cooling system comprising at least two modular cooling units (MCUs) 920, 930 labeled MCU 1 & MCU 2, respectively. The MCUs are configured and coupled to provide system coolant in parallel to the plurality of heat-generating electronic subsystems for facilitating liquid cooling thereof. Each MCU 920, 930 includes a liquid-to-liquid heat exchanger 921, 931, a first (facility) coolant loop 922, 932, and a second (system) coolant loop, 923, 933, respectively. The first coolant loops 922, 932 are coupled to receive chilled coolant, such as facility coolant, via (for example) facility water supply line 440 and facility water return line 441. Each first coolant loop 922, 932 passes at least a portion of the chilled coolant flowing therein through the respective liquid-to-liquid heat exchanger 921, 931. Each second coolant loop 923, 933 provides cooled system coolant to the plurality of heat-generating electronic subsystems 910 of electronics rack 900, and expels heat via the respective liquid-to-liquid heat exchanger 921, 931 from the plurality of heat-generating electronic subsystems 910 to the chilled coolant in the first coolant loop 922, 932.

The second coolant loops 923, 933 include respective coolant supply lines 924, 934, which supply cooled system coolant from the liquid-to-liquid heat exchangers 921, 931 to a system coolant supply manifold 940. System coolant supply manifold 940 is coupled via flexible supply hoses 941 to the plurality of heat-generating electronics subsystems 910 of electronics rack 900 (e.g., using quick connect couplings connected to respective ports of the system coolant supply manifold). Similarly, second coolant loops 923, 933 include system coolant return lines 925, 935 coupling a system coolant return manifold 950 to the respective liquid-to-liquid heat exchangers 921, 931. System coolant is exhausted from the plurality of heat-generating electronics components 910 via flexible return hoses 951 coupling the heat-generating electronics subsystems to system coolant return manifold 950. In one embodiment, the return hoses may couple to respective ports of the system coolant return manifold via quick connect couplings. Further, in one embodiment, the plurality of heat-generating electronics subsystems each include a respective liquid-based cooling subsystem, such as described above in connection with FIGS. 7 & 8, coupled to flexible supply hoses 941 and flexible return hoses 951 to facilitate liquid cooling of one or more heat-generating electronics components disposed within the electronics subsystem.

In addition to supplying and exhausting system coolant in parallel to the plurality of heat-generating electronics subsystems of the electronics rack, the MCUs 920, 930 also provide in parallel system coolant to an air-to-liquid heat exchanger 960 disposed, for example, for cooling air passing through the electronics rack from an air inlet side to an air outlet side thereof in normal operating mode. By way of example, air-to-liquid heat exchanger 960 is a rear door heat exchanger disposed at the air outlet side of electronics rack 900. Further, in one example, air-to-liquid heat exchanger 960 is sized to cool substantially all air egressing from electronics rack 900, and thereby reduce air-conditioning requirements for a data center containing the electronics rack. In one example, a plurality of electronics racks in the data center are each provided with a cooling system such as described herein and depicted in FIG. 9.

In the embodiment of FIG. 9, system coolant flows to and from air-to-liquid heat exchanger 960 via a coolant supply line 961 coupling system coolant supply manifold 940 to air-to-liquid heat exchanger 960, and a coolant return line 962 coupling the air-to-liquid heat exchanger to system coolant return manifold 950. Quick connect couplings may be employed at the inlet and outlet of air-to-liquid heat exchanger 960 and/or at corresponding ports at the system coolant supply and return manifolds to facilitate connection of coolant supply and return lines 961, 962. In one embodiment, it is assumed that one MCU of the two MCUs illustrated is incapable of being sized to function within required design parameters as a primary MCU (with the other MCU being a backup MCU) to extract the full heat load from both the plurality of heat-generating electronics subsystems and the air-to-liquid heat exchanger. Therefore, the two MCUs 920, 930 are assumed in normal operation to be functioning in parallel. This also ensures a measure of redundancy to the cooling system.

As shown, the cooling system further includes a system controller 970, and an MCU control 1 980 and an MCU control 2 990, which cooperate together to monitor system coolant temperature of each MCU, and automatically isolate air-to-liquid heat exchanger 960 upon detection of failure of one MCU (as well as to ensure shut down of a failing MCU) so as not to degrade cooling capability of the system coolant provided by the remaining operational MCU to the electronics subsystems of the rack. In one embodiment, the MCU control 1 and the MCU control 2 are control cards, each associated with a respective MCU.

As shown, system controller 970 is coupled to both MCU control 1 and the MCU control 2. MCU control 1 980 is coupled in this embodiment to a temperature sensor $T_1$ 981, which is disposed to sense system coolant temperature within system coolant supply line 924, for example, near a coolant outlet of liquid-to-liquid heat exchanger 921 within MCU 1 920. Additionally, MCU control 1 980 is coupled to a solenoid-actuated isolation valve 982, which in the embodiment depicted, is disposed within coolant supply line 961 coupling in fluid communication system coolant supply manifold 940 to air-to-liquid heat exchanger 960. Similarly, MCU control 2 990 couples to MCU 2 930, as well as to a second temperature sensor $T_2$ 991, disposed for sensing system coolant temperature within system coolant supply line 934, and to a second isolation valve $S_2$ 992, which in the example depicted, is coupled to coolant return line 962 coupling air-to-liquid heat exchanger 960 to system coolant return manifold 950.

Details on processings implemented by MCU control 1, MCU control 2 and the system controller are provided in co-pending, commonly assigned U.S. patent application Ser. No. 11/942,207, filed Nov. 19, 2007, entitled "System and Method for Facilitating Cooling of a Liquid-Cooled Electronics Rack", and published on May 21, 2009, as U.S. Patent Publication No. 2009/0126909 A1, which is hereby incorporated herein by reference in its entirety.

FIGS. 10-13 depict a further enhanced cooling system and method for facilitating (in part) cooling of a bulk power assembly within the liquid-cooled electronics racks described above. Bulk power supplies for current and future high-end and high-performance computing systems continue to increase in power delivery to meet the needs of these systems. Currently, space limitations necessitate an increase in component density in the power assemblies. The high resulting power dissipation as heat and the small space allocation drive high heat fluxes that may require liquid cooling to maintain appropriate component temperatures for function and reliability. Further, the need for energy efficiency suggests the implementation of a standby power state (or mode) where minimum energy is consumed maintaining the system ready for utilization within a minimum waiting period. Such a standby mode involves networking and power components of the power assembly that must be powered with the expectation that a signal will eventually be sent to activate the entire system. One solution to cooling the bulk power assembly for such high-end computing systems is to employ air-cooling. However, more and more air will necessarily need to be impelled though the power supply assembly to meet ever-increasing loads during normal operating mode (with the air-moving devices being slowed in standby mode). Thus, a liquid-based solution to cooling the bulk power supply assembly is believed advantageous.

Figure 10:
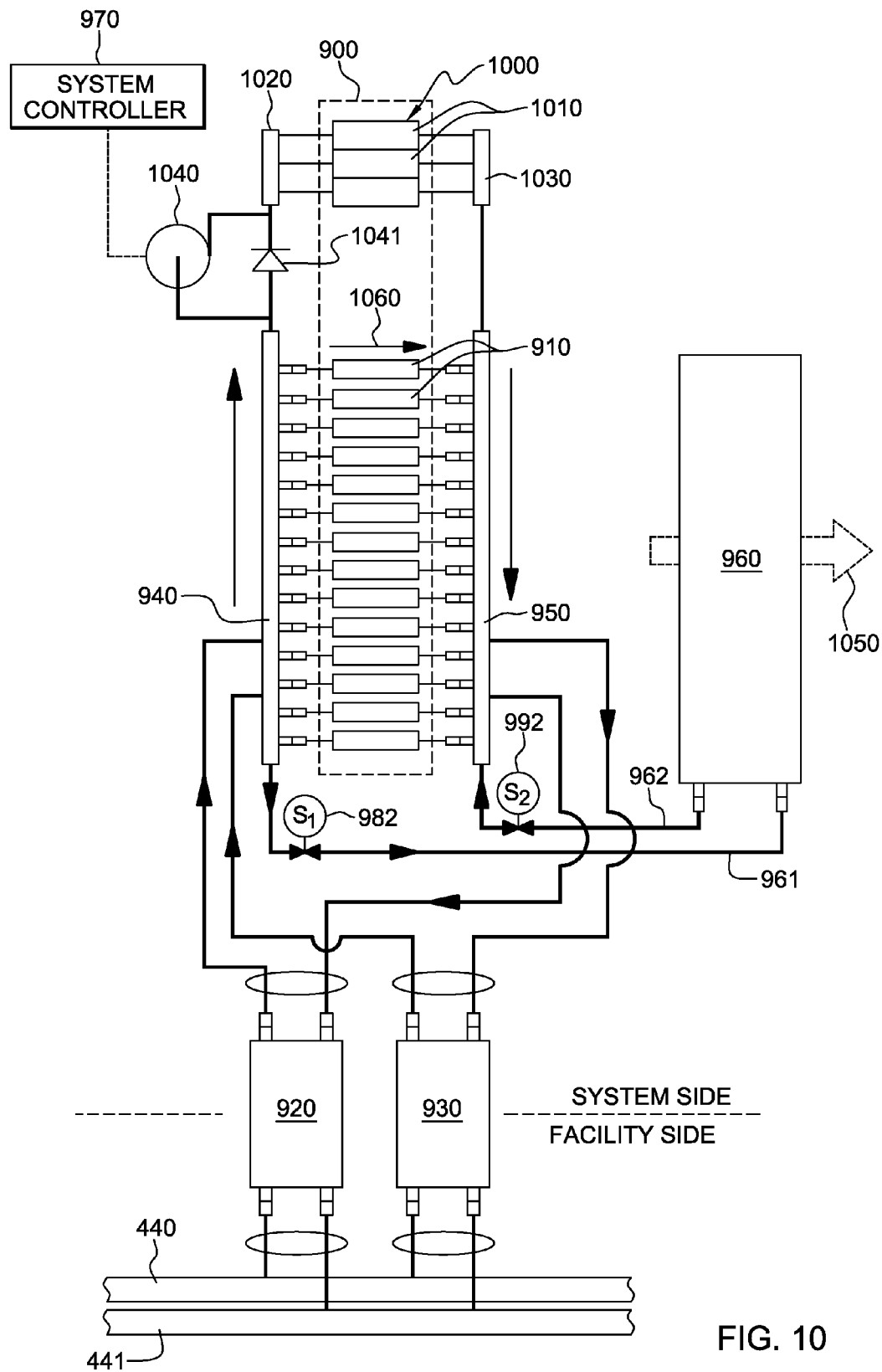
FIG. 10 is a schematic of one embodiment of a multi-mode cooling system for cooling electronics of the liquid-cooled electronics rack of FIG. 9, shown with system coolant flow in normal operating mode, in accordance with an aspect of the present invention.

FIG. 10 illustrates one example of a bulk power assembly (BPA) cooling system and method (in accordance with an aspect of the present invention), wherein the bulk power assembly 1000 is shown within electronics rack 900, in an upper portion thereof. Bulk power assembly 1000 includes (in this embodiment) a plurality of bulk power drawers 1010, within which components may be immersed in a dielectric coolant, with an integrated cold plate being provided to transfer heat from the immersion coolant to a system coolant (such as employed above in connection with the liquid-cooled electronics rack of FIG. 9).

In the liquid-cooled electronics rack embodiment of FIG. 10, electronics rack 900 includes a plurality of heat-generating electronics subsystems 910, which are liquid-cooled employing a cooling system comprising one or more modular cooling units (MCUs), with two MCUs 920, 930 being illustrated, disposed in a lower portion of electronics rack 900. The MCUs are configured and coupled to provide, via the system coolant loop, system coolant in parallel to the plurality of heat-generating electronics subsystems 910, and to at least one bulk power assembly 1000 for facilitating liquid cooling thereof. Each MCU 920, 930 includes a liquid-to-liquid heat exchanger, a facility coolant loop portion and a system coolant loop portion. The facility coolant loop portions are coupled to a facility coolant loop to receive chilled coolant, such as facility coolant, via (for example) facility water supply line 440 and facility water return line 441, and to pass at least a portion of the chilled coolant flowing therein through the respective liquid-to-liquid heat exchanger. Each system coolant loop portion provides (in normal operating mode) cooled system coolant to the plurality of heat-generating electronics subsystems 910 of electronics rack 900 and to bulk power drawers 1010 of bulk power assembly 1000, and expels heat via the respective liquid-to-liquid heat exchanger from the plurality of heat-generating electronics subsystems 910 and bulk power drawers 1010 to the chilled coolant in the facility coolant loop.

The system coolant loop includes the respective coolant supply lines which supply cooled system coolant from the liquid-to-liquid heat exchangers of the MCUs to a system coolant supply manifold 940. System coolant supply manifold 940 is coupled via flexible supply hoses to the plurality of heat-generating electronics subsystems 910 of electronics rack 900. Similarly, system coolant return lines couple a system coolant return manifold 950 to the respective liquid-to-liquid heat exchangers of the MCUs 920, 930. System coolant is exhausted from the plurality of heat-generating electronics subsystems 910 via flexible return hoses coupling the heat-generating electronics subsystems to system coolant return manifold 950. In one embodiment, and by way of example only, the plurality of heat-generating electronics subsystems each include a respective liquid-based cooling subsystem, such as described above in connection with FIGS. 7 & 8 to facilitate cooling of one or more electronic components disposed within the electronics subsystem.

In addition to supplying and exhausting system coolant in parallel to the plurality of heat-generating electronic subsystems of the electronics rack, the MCUs 920, 930 also provide in parallel system coolant to an air-to-liquid heat exchanger 960 disposed, for example, for cooling air passing through the electronics rack from an air inlet side to an air outlet side thereof. By way of example, air-to-liquid heat exchanger 960 is a rear door heat exchanger disposed at the air outlet side of electronics rack 900. Further, in one example, air-to-liquid heat exchanger 960 is sized to cool in normal operating mode substantially all air egressing from electronics rack 900, and thereby reduce air-conditioning requirements for a data center containing the electronics rack. In one example, a plurality of electronics racks in the data center are each provided with a cooling system such as described herein and depicted in FIG. 10.

In the embodiment of FIG. 10, system coolant flows to and from air-to-liquid heat exchanger 960 via a coolant supply line 961 coupling system coolant supply manifold 940 to air-to-liquid heat exchanger 960, and a coolant return line 962 coupling the air-to-liquid heat exchanger to system coolant return manifold 950. In the embodiment depicted, a first solenoid-actuated isolation valve 982 is disposed within coolant supply line 961 coupling in fluid communication system coolant supply manifold 940 and air-to-liquid heat exchanger 960, and a second solenoid-actuated isolation valve $S_2$ 992 is coupled to coolant return line 962 connecting air-to-liquid heat exchanger 960 to system coolant return manifold 950. These isolation valves allow for selective isolation of the air-to-liquid heat exchanger from the system coolant loop, for example, for servicing of the air-to-liquid heat exchanger.

In normal operating mode, system coolant flows from system coolant supply manifold 940 to electronics subsystems 910 and from electronics subsystems 910 to system coolant return manifold 950, as indicated by direction arrow 1060. Additionally, in normal operating mode, cooled system coolant is supplied from system coolant supply manifold 940 via coolant supply line 961 to air-to-liquid heat exchanger 960 for cooling airflow 1050 passing through electronics rack 900. The heated system coolant is then exhausted via system coolant return line 962 to system coolant return manifold 950, as noted above, for return to the MCU(s).

Figure 12:
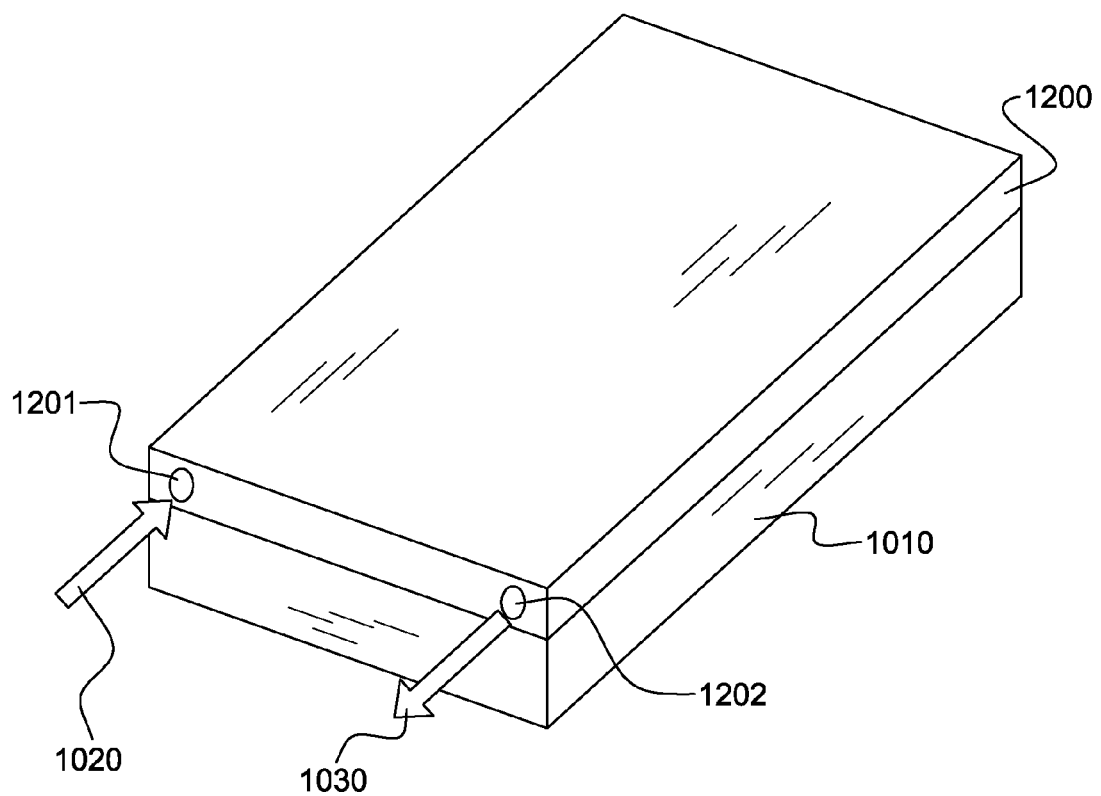
FIG. 12 depicts one embodiment of a bulk power drawer of a bulk power assembly of a system such as depicted in FIGS. 10 & 11, in accordance with an aspect of the present invention.

In the enhanced cooling system embodiment depicted in FIG. 10, liquid-based cooling of one or more bulk power drawers 1010 of bulk power assembly 1000 is also provided. Numerous approaches for liquid-cooling the bulk power drawers of bulk power assembly 1000 are implementable. FIG. 12 illustrates one such cooling approach, wherein a liquid-cooled cold plate 1200 is coupled to an immersion-cooled bulk power drawer 1010 of the bulk power assembly. In this embodiment, a coolant inlet manifold (or line) 1020 is coupled to a system coolant inlet 1201 of liquid-cooled cold plate 1200 and a coolant outlet manifold (or line) 1030 is coupled to a system coolant outlet 1202 of liquid-cooled cold plate 1200. The coolant inlet and outlet manifolds 1020, 1030 are illustrated in FIG. 10, by way of example only, as being in fluid communication with each bulk power drawer 1010 of bulk power assembly 1000.

Note that, depending upon the implementation, only one bulk power drawer or multiple bulk power drawers may be liquid-cooled via the system coolant. Further, the liquid-cooling approach depicted in FIG. 12 is provided by way of example only. Alternative liquid-cooling embodiments may be utilized. For example, if the system coolant is a dielectric coolant, then the system coolant could be pumped directly through the immersion-cooled bulk power drawers 1010. Alternatively, depending upon the bulk power drawer implementation, immersion-cooling of the drawer may be omitted, with a liquid-cooled cold plate being attached to one or more components thereof in a manner similar to that described above in connection with FIGS. 7 & 8.

By way of further detail, a bulk power assembly may include a chassis housing several electronics drawers configured to convert available utility power to voltages and frequencies usable by the computing system (or more generally, the electronics rack). At least three different types of drawers are typically employed. For example, a bulk power regulator (BPR) drawer does the bulk power conversion from, for example, 400V three-phase AC to 350V DC, a bulk power communications hub (BPCH) provides control and communications functions for the bulk power assembly, and a bulk power distribution drawer (BPD) distributes the converted electrical energy to the computing system. One aspect of the invention disclosed herein is to sealably enclose each bulk power drawer, with the heat-generating components thereof immersed in a dielectric coolant, such as a refrigerant, polyalphaolefin (PAO) oil, a hydrofluoroether liquid, a fluorocarbon liquid, etc., and to provide at least one heat exchange surface, such as the surface of a cold plate, or a finned surface, or a fin and tube heat exchanger, etc., where the dielectric coolant transfers heat to the system coolant circulating through the liquid-cooled electronics rack.

Figure 11:
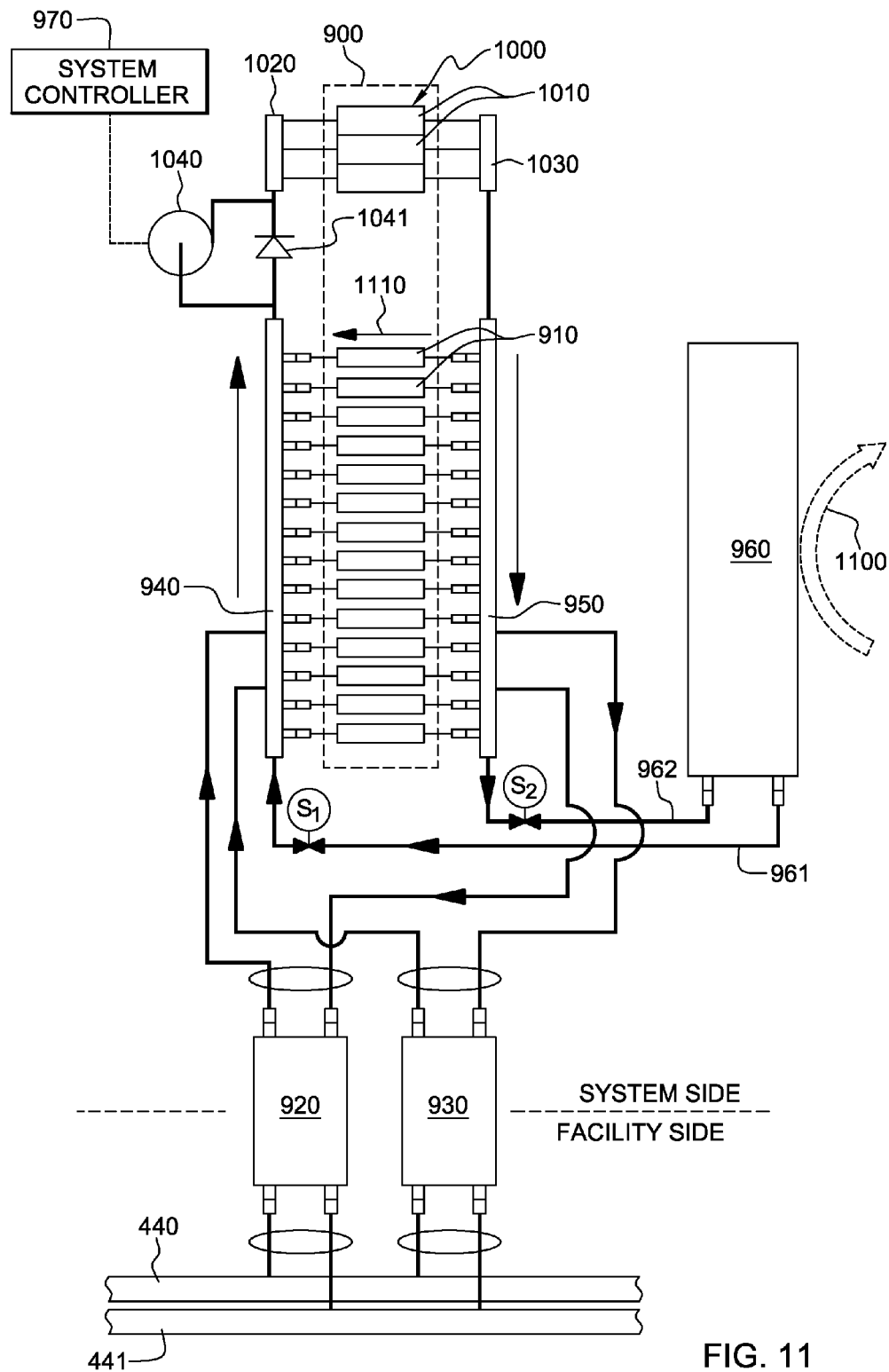
FIG. 11 depicts the cooling system of FIG. 10, shown with system coolant flow in standby mode, in accordance with an aspect of the present invention.

In the embodiment illustrated in FIGS. 10 & 11, system coolant supply manifold 940 and system coolant return manifold 950 are illustrated (by way of example only) as being separate from the respective coolant inlet manifold 1020 and coolant outlet manifold 1030 of the bulk power assembly. Alternatively, these manifold could be common respective supply and return manifolds. In either case, the supply manifold(s) is modified to include a check valve 1041 and a standby pump 1040 disposed in parallel fluid communication with the check valve, as illustrated in FIGS. 10 & 11. Standby pump 1040 is controlled by system controller 970, and is OFF in normal operating mode, and is ON in standby mode. The arrows in FIG. 10 illustrate the direction of system coolant flow through the electronics rack in normal operating mode. Specifically, in normal operating mode, system coolant moves through system coolant inlet manifold 940 and coolant inlet manifold 1020 to electronics subsystems 910 and bulk power drawers 1010 of the BPA in parallel, and is exhausted via coolant outlet manifold 1030 and system coolant return manifold 950 to the operating MCUs 920, 930. The operating MCUs cool the exhausted system coolant via facility coolant passing through the facility coolant loop, and provide cooled system coolant back to the supply manifolds 940, 1020. Additionally, in normal operating mode, cooled system coolant is provided from system coolant supply manifold 940 to air-to-liquid heat exchanger 960 for cooling air 1050 passing through the electronics rack. The warmed system coolant is returned via system coolant return manifold 950 from air-to-liquid heat exchanger 960 to the operating MCUs. Depending upon the implementation, a majority of the heat load of the electronics rack can be removed using the liquid-cooling approach depicted in FIG. 10.

When the system is in normal operating mode, each of the bulk power drawers is active and the heat-generating components are in normal operation, that is, there is a large amount of heat dissipation (e.g., 2.8 kW) in the drawers that is to be dissipated via the immersion coolant to the system coolant and eventually away from the system coolant entirely (by, for example, the facility coolant). To conserve energy when the system is not in use, and to also maintain the system prepared to react quickly to a new workload, it is deemed desirable to implement a standby mode, wherein a minimum amount of heat-generating components are active in the bulk power assembly, but few (if any) of the electronics subsystems within the computing system are powered. In this state, a network signal to the BPCH can trigger the system to resume normal operation. In the standby mode, cooled system coolant is assumed to not be provided by the MCUs of the electronics rack (or computing system), that is, the MCUs are assumed to be off. Since some heat dissipation takes place within the bulk power assembly in standby mode, some coolant flow is desired to prevent the storage of heat within the bulk power assembly (that is, to prevent any heat storage and the associated temperature increase which may result in a failure).

In one embodiment, standby pump 1040 and check valve 1041 are provided within the plumbing line between the system coolant supply manifold and the bulk power coolant supply manifold. The standby pump is coupled in parallel with the plumbing line such that flow impelled by the pump flows in the same direction as the flow between the supply manifolds during normal operating mode, with the check valve being in series with the plumbing line to prevent the flow of coolant in the opposite direction to coolant flow in the line during normal operation. When the system is in normal operating mode, system coolant flows through the check valve and the pump is inactive (i.e., off). However, as illustrated in FIG. 11, in standby mode, standby pump 1040 begins to impel the flow of system coolant through the system coolant loop, for example, at a substantially lower flow rate than in normal operating mode. Ideally, the standby pump is disposed in close association to the bulk power assembly, and may even be part of the bulk power assembly, to ensure pumping of system coolant through the bulk power assembly in standby mode, while minimizing the pumping power required. At least a portion of the system coolant circulating through the bulk power assembly in standby mode passes from the system coolant return manifold 950 (via coolant return line 962) to air-to-liquid heat exchanger 960 and from air-to-liquid heat exchanger 960 (via coolant supply line 961) to the deactivated MCU(s) and thereafter to system coolant supply manifold 940. As one example, if the flow rate of coolant in standby mode is to be 10% of the normal operating mode system flow rate, then the required pump impeller diameter might be about half the size in the standby pump compared with the MCU pump(s).

As illustrated, air-side natural convection 1100 may be employed (in one embodiment) in expelling heat from the bulk power assembly via system coolant passing through the air-to-liquid heat exchanger. Note that in the standby mode, the direction 1110 of system coolant flow through electronics subsystems 910 is reversed from direction 1060 (see FIG. 10) of system coolant flow through the electronics subsystems in normal operating mode, and the direction of system coolant flow through the air-to-liquid heat exchanger is reversed from the direction of system coolant flow through the air-to-liquid heat exchanger in normal operating mode. Note also that, in standby mode, it is contemplated that MCUs 920, 930 will be off, and that electronics subsystems 910 will be powered down. Further, note that standby power loss in the bulk power assembly is approximately 1.5% of the normal operating dissipation (in one embodiment).

In an alternate embodiment, standby pump 1040 may be replaced with control of the system coolant pumps within MCUs 920, 930. Specifically, the pumps within the MCUs could be modulated between a higher pump speed for normal operating mode and a lower pump speed for standby mode, if desired, with the system controller controlling the mode of operation via, for example, appropriate network command(s).

Figure 13:
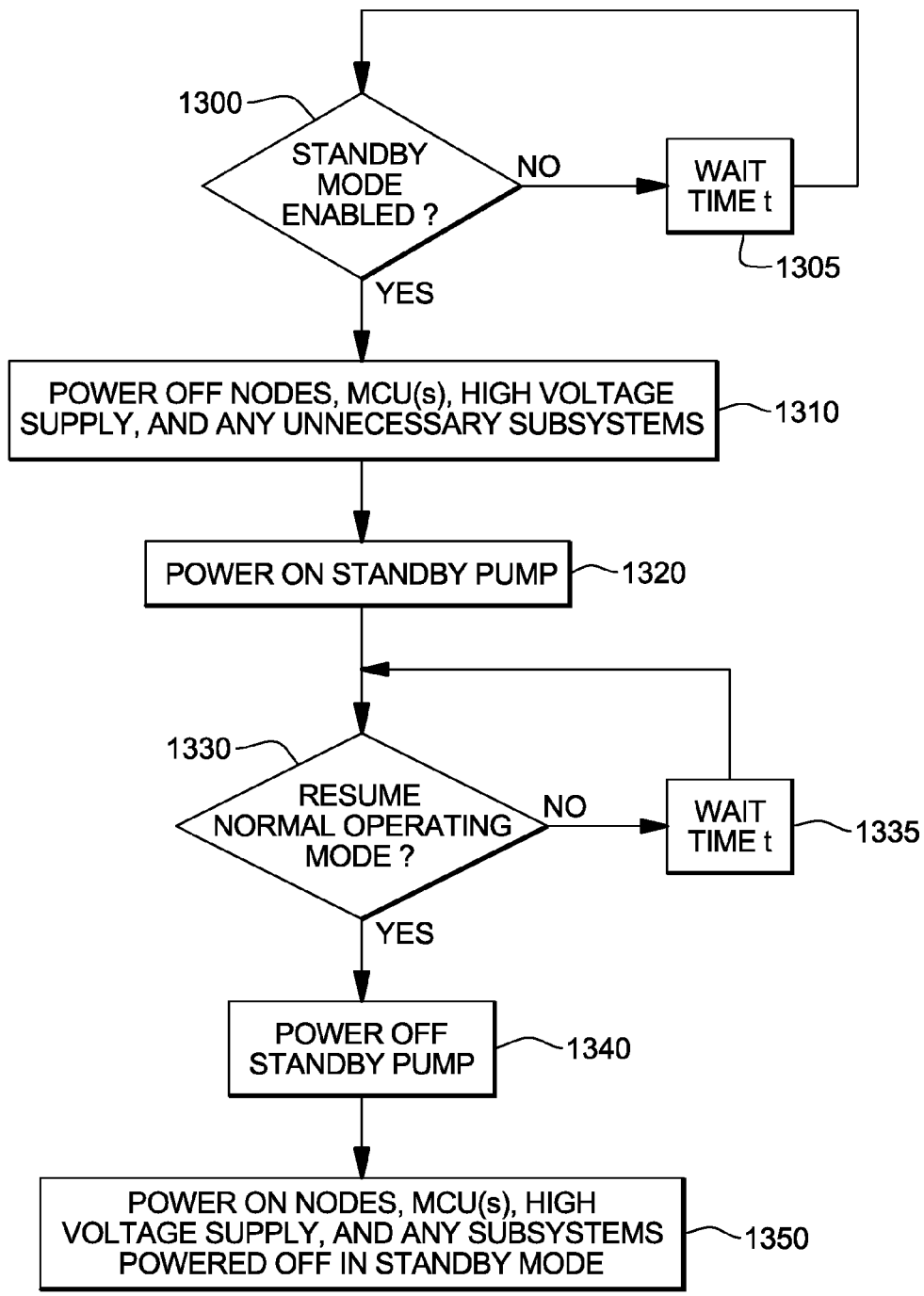
FIG. 13 is a flowchart of one embodiment of a process for transitioning the cooling system of FIGS. 10 & 11 into standby mode, and from standby mode into normal operating mode, in accordance with an aspect of the present invention.

FIG. 13 illustrates one embodiment of processing implemented (for example, by system controller 970) in switching between normal operating mode and standby mode. Initially, the controller determines whether standby mode is enabled 1300, and if "no", waits a time interval t 1305 before again determining whether standby mode is enabled. Once standby mode is enabled, the controller powers off the electronics subsystems (i.e., the nodes), the MCUs, the high voltage supply (in the BPA), and any other unnecessary subsystems 1310, and powers on the standby pump 1320, which transitions the system to standby mode. From standby mode, processing inquires whether normal operating mode is to be resumed 1330, and if "no", then waits a time interval t 1335 before again inquiring whether normal operating mode is to be resumed. Once normal operating mode is to be resumed, the controller powers off the standby pump 1340, and powers on the electronics subsystems (i.e., the nodes), the MCUs, the high voltage supply, and any subsystems powered off in standby mode 1350.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims

What is claimed is:

1. A system for facilitating cooling of components of an electronics rack comprising at least one heat-generating electronics subsystem and at least one bulk power assembly providing power to the at least one heat-generating electronics subsystem, the system comprising:
   at least one modular cooling unit (MCU) associated with the electronics rack and configured to provide, via a system coolant loop, system coolant to the at least one heat-generating electronics subsystem and the at least one bulk power assembly for facilitating cooling thereof, wherein each MCU of the at least one MCU comprises a liquid-to-liquid heat exchanger, a facility coolant loop portion and a system coolant loop portion, and when in normal operating mode, a facility coolant loop receives chilled coolant from a source and passes at least a portion thereof through the liquid-to-liquid heat exchanger of each MCU via the facility coolant loop portion thereof, and the system coolant loop provides cooled system coolant to the at least one heat-generating electronics subsystem and the at least one bulk power assembly, and expels heat in the liquid-to-liquid heat exchanger from the at least one heat-generating electronics subsystem and the at least one bulk power assembly to the chilled coolant in the facility coolant loop;

an air-to-liquid heat exchanger associated with the electronics rack and in fluid communication with the system coolant loop;

at least one pump in fluid communication with the system coolant loop; and a controller coupled to the at least one pump for adjusting operation of the at least one pump to control flow rate of system coolant through the system coolant loop dependent upon a mode of operation, wherein in the normal operating mode, a first system coolant flow rate is provided through the system coolant loop to cool the at least one heat-generating electronics subsystem and the at least one bulk power assembly, and in a standby mode, a second system coolant flow rate is provided through the system coolant loop to cool the at least one bulk power assembly, wherein the first system coolant flow rate is greater than the second system coolant flow rate, and wherein in standby mode, at least a portion of the system coolant flowing through the system coolant loop passes through the air-to-liquid heat exchanger to expel heat in the air-to-liquid heat exchanger from the at least one bulk power assembly to ambient air.

2. The system of claim 1, wherein the at least one pump comprises at least one standby pump coupled in fluid communication with the system coolant loop providing system coolant to the at least one heat-generating electronics subsystem and the at least one bulk power assembly.

3. The system of 2, wherein the at least one standby pump is disposed at a system coolant inlet to the at least one bulk power assembly, external to the at least one MCU.

4. The system of claim 3, wherein the at least one standby pump is disposed in the system coolant loop between a first coolant inlet manifold for the at least one heat-generating electronics subsystem and a second coolant inlet manifold for the at least one bulk power assembly, and wherein the at least one standby pump pumps system coolant from the first system coolant manifold to the second system coolant manifold when operating in the standby mode.

5. The system of claim 2, wherein the at least one standby pump is disposed in parallel with a check valve through which cooled system coolant flows to the at least one bulk power assembly.

6. The system of claim 1, wherein in standby mode, a direction of system coolant flow through the at least one air-to-liquid heat exchanger is reversed from a direction of system coolant flow through the at least one air-to-liquid heat exchanger in normal operating mode.

7. The system of claim 1, wherein in standby mode, the at least one modular cooling unit is off, the at least one bulk power assembly dissipates power at a lower level than in normal operating mode, and the air-to-liquid heat exchanger expels heat from the at least one bulk power assembly to ambient air via natural air convection.

8. The system of claim 1, wherein in standby mode, the air-to-liquid heat exchanger expels heat, via the system coolant, from the at least one bulk power assembly to ambient air, and wherein in normal operating mode, the air-to-liquid heat exchanger extracts heat from air passing through the electronics rack.

9. The system of claim 1, wherein the at least one bulk power assembly comprises at least one bulk power drawer with components thereof immersed in a dielectric coolant, the system coolant facilitating cooling of the at least one bulk power drawer.

10. A cooled electronics system comprising:

an electronics rack comprising at least one heat-generating electronics subsystem and at least one bulk power assembly providing power to the at least one heat-generating electronics subsystem;

at least one modular cooling unit (MCU) associated with the electronics rack and configured to provide, via a system coolant loop, system coolant to the at least one heat-generating electronics subsystem and the at least one bulk power assembly for facilitating cooling thereof, wherein each MCU of the at least one MCU comprises a liquid-to-liquid heat exchanger, a facility coolant loop portion and a system coolant loop portion, and when in normal operating mode, a facility coolant loop receives chilled coolant from a source and passes at least a portion thereof through the liquid-to-liquid heat exchanger of each MCU via the facility coolant loop portion thereof, and the system coolant loop provides cooled system coolant to the at least one heat-generating electronics subsystem and the at least one bulk power assembly, and expels heat in the liquid-to-liquid heat exchanger from the at least one heat-generating electronics subsystem and the at least one bulk power assembly to the chilled coolant in the facility coolant loop;

an air-to-liquid heat exchanger associated with the electronics rack and in fluid communication with the system coolant loop;

at least one pump in fluid communication with the system coolant loop; and a controller coupled to the at least one pump for adjusting operation of the at least one pump to control flow rate of system coolant through the system coolant loop dependent upon a mode of operation, wherein in the normal operating mode, a first system coolant flow rate is provided through the system coolant loop to cool the at least one heat-generating electronics subsystem and the at least one bulk power assembly, and in a standby mode, a second system coolant flow rate is provided through the system coolant loop to cool the at least one bulk power assembly, wherein the first system coolant flow rate is greater than the second system coolant flow rate, and wherein in standby mode, at least a portion of the system coolant flowing through the system coolant loop passes through the air-to-liquid heat exchanger to expel heat in the air-to-liquid heat exchanger from the at least one bulk power assembly to ambient air.

11. The cooled electronics system of claim 10, wherein the at least one bulk power assembly is disposed in an upper portion of the electronics rack, and the at least one MCU is disposed in a lower portion of the electronics rack, and wherein the air-to-liquid heat exchanger is coupled to a rear door hingedly affixed to the electronics rack at an air outlet side thereof, wherein in normal operating mode, air moves through the electronics rack from an air inlet side to the air outlet side thereof, and the air-to-liquid heat exchanger cools air egressing from the electronics rack.

12. The cooled electronics system of claim 10, wherein in standby mode, the at least one MCU is off, the at least one bulk power assembly dissipates power at a lower rate, and system coolant flowing through the system coolant loop expels heat in the air-to-liquid heat exchanger from the at least one bulk power assembly to the ambient air via natural air convection.

13. The cooled electronics system of claim 10, wherein the at least one pump comprises at least one standby pump coupled in fluid communication with the system coolant loop providing system coolant to the at least one heat-generating electronics subsystem and the at least one bulk power assembly in normal operating mode, and wherein the at least one standby pump is disposed at a system coolant inlet to the at least one bulk power assembly, external to the at least one MCU.

14. The cooled electronics system of claim 13, wherein the at least one standby pump is disposed in the system coolant loop between a first coolant inlet manifold for the at least one heat-generating electronics subsystem and a second coolant inlet manifold for the at least one bulk power assembly, and wherein the at least one standby pump pumps system coolant from the first system coolant manifold to the second system coolant manifold when operating in standby mode.

15. The cooled electronics system of claim 10, wherein in standby mode, system coolant flows through the at least one air-to-liquid heat exchanger in a direction reversed from a direction of system coolant flow through the at least one air-to-liquid heat exchanger in normal operating mode.

16. The cooled electronics system of claim 10, wherein the at least one pump is disposed within the at least one MCU, and wherein the controller controls pump speed of the at least one pump dependent upon the mode of operation, wherein pump speed is greater in normal operating mode than in standby mode.

17. The cooled electronics system of claim 10, wherein in standby mode the at least one heat-generating electronics subsystem is powered off, the at least one bulk power assembly dissipates power at a lower level than in normal operating mode, and the air-to-liquid heat exchanger expels, via the system coolant, heat from the at least one bulk power assembly to ambient air via natural air convection.

18. The cooled electronics system of claim 10, wherein the at least one bulk power assembly comprises at least one bulk power drawer with components thereof immersed in a dielectric coolant, and the system coolant facilitates cooling of the at least one bulk power drawer.

19. A method of cooling components of an electronics rack comprising at least one heat-generating electronics subsystem and at least one bulk power assembly providing power to the at least one heat-generating electronics subsystem, the method comprising:
  employing at least one modular cooling unit (MCU) associated with the electronics rack to provide, via a system coolant loop, system coolant to the at least one heat-generating electronics subsystem and the at least one bulk power assembly for facilitating cooling thereof, wherein each MCU of the at least one MCU comprises a liquid-to-liquid heat exchanger, a facility coolant loop portion and a system coolant loop portion, and when in normal operating mode, a facility coolant loop receives chilled coolant from a source and passes at least a portion thereof through the liquid-to-liquid heat exchanger of each MCU via the facility coolant loop portion thereof, and the system coolant loop provides cooled system coolant to the at least one heat-generating electronics subsystem and the at least one bulk power assembly, and expels heat in the liquid-to-liquid heat exchanger from the at least one heat-generating electronics subsystem and the at least one bulk power assembly to the chilled coolant in the facility coolant loop;
  pumping at least a portion of the system coolant in the system coolant loop through an air-to-liquid heat exchanger associated with the electronics rack and in fluid communication with the system coolant loop; and
  controlling at least one pump in fluid communication with the system coolant loop to control flow rate of system coolant through the system coolant loop dependent upon a mode of operation, wherein in the normal operating mode, a first system coolant flow rate is provided through the system coolant loop to cool the at least one heat-generating electronics subsystem and the at least one bulk power assembly, and in a standby mode, a second system coolant flow rate is provided through the system coolant loop to cool the at least one bulk power assembly, wherein the first system coolant flow rate is greater than the second system coolant flow rate, and wherein in standby mode, at least a portion of the system coolant flowing through the system coolant loop passes through the air-to-liquid heat exchanger and expels heat in the air-to-liquid heat exchanger from the at least one bulk power assembly to ambient air.

20. The method of claim 19, wherein the at least one pump comprises at least one standby pump coupled in fluid communication with the system coolant loop, disposed external to the at least one MCU, wherein in standby mode, the at least one MCU is off, the at least one standby pump is on, and a direction of system coolant flow from the system coolant loop to the at least one heat-generating electronics subsystem is reversed from a direction of system coolant flow from the system coolant loop to the at least one heat-generating electronics subsystem in normal operating mode, and wherein in standby mode, the at least one bulk power assembly dissipates power at a lower level than in normal operating mode.

* * * * *